United States Patent
Lee et al.

(10) Patent No.: US 7,956,788 B2
(45) Date of Patent: Jun. 7, 2011

(54) TECHNIQUE FOR PHOTONIC ANALOG-TO-DIGITAL SIGNAL CONVERSION

(75) Inventors: Jaesik Lee, Basking Ridge, NJ (US); Young-Kai Chen, Berkeley Heights, NJ (US)

(73) Assignee: Alcatel-Lucent USA Inc., Murray Hill, NJ (US)

( * ) Notice: Subject to any disclaimer, the term of this patent is extended or adjusted under 35 U.S.C. 154(b) by 0 days.

(21) Appl. No.: 12/387,301

(22) Filed: Apr. 30, 2009

(65) Prior Publication Data
US 2010/0277354 A1    Nov. 4, 2010

(51) Int. Cl.
*H03M 1/12*    (2006.01)
(52) U.S. Cl. .................... 341/155; 341/137
(58) Field of Classification Search .......... 341/137, 341/155, 122, 159; 250/225
See application file for complete search history.

(56) References Cited

U.S. PATENT DOCUMENTS

| | | | | |
|---|---|---|---|---|
| 4,947,170 | A | * | 8/1990 | Falk ............................ 341/137 |
| 5,010,346 | A | * | 4/1991 | Hamilton et al. ............. 341/137 |
| 6,525,682 | B2 | * | 2/2003 | Yap et al. ..................... 341/137 |
| 2004/0175174 | A1 | * | 9/2004 | Suhami ......................... 398/43 |
| 2008/0218257 | A1 | | 9/2008 | Lee ............................... 327/561 |

OTHER PUBLICATIONS

Ken Poulton, et. al - "A 20GS/s 8b ADC with a 1MB Memory in 0.18μm CMOS", ISSCC 2003/Session 18/NYQUIST A/D Converters/Paper 18.1, 2003 IEEE International Solid-State Circuits Conference 0-7803-7707-9/03—3 pages.

* cited by examiner

*Primary Examiner* — Peguy JeanPierre
(74) *Attorney, Agent, or Firm* — Alex L. Yip

(57) ABSTRACT

In an inventive photonic analog-to-digital signal converter (ADC), multiple opto-electric sampling devices are employed to successively sample an analog signal input. Optical clock signals having the same frequency but different clock phases are used, which are associated with the opto-electric sampling devices, respectively. Each sampling device takes samples of the analog signal input in response to the optical clock signal associated therewith. The resulting samples are processed to produce quantized samples. The inventive ADC outputs a digital signal representing the quantized samples.

20 Claims, 7 Drawing Sheets

US 7,956,788 B2

TECHNIQUE FOR PHOTONIC ANALOG-TO-DIGITAL SIGNAL CONVERSION

FIELD OF THE INVENTION

The invention relates to a technique for signal processing and, in particular, to a technique for analog-to-digital signal conversion using optical clocking.

BACKGROUND OF THE INVENTION

This section introduces aspects that may help facilitate a better understanding of the invention. Accordingly, the statements of this section are to be read in this light and are not to be understood as admissions about what is prior art or what is not prior art.

Digital media (e.g., digital audio, image and video) have become an integral part of our daily life. Increasingly high speed digital signal processors and computers, and sophisticated coding techniques (e.g., MP3, JPEG, MPEG2, etc.) lend great support to the proliferation of use of digital media. Analog-to-digital signal converters (ADCs) are essential for transforming the analog media we perceive to the digital media to take advantage of the advanced digital technology. As people demand higher and higher digital quality, traditional electronic ADCs no longer can afford the desired bandwidth and resolution in certain digital applications, e.g., digital communications, where a sampling rate on the order of ten giga-Hertz (GHz) is required. For example, in K. Pulton et al., "A 20 GS/s 8b ADC with a 1MB Memory in 0.18 µm CMOS," IEEE ISSCC 2003/Session 18/Nyquist A/D Converters/Paper 18.1, 2003, an electronic ADC is described whose sampling rate is 20 GHz. However, such an ADC can only afford a reasonable bit resolution within 1 GHz input bandwidth, which no longer is sufficient for many latest digital applications. Because of the bandwidth and resolution limitations imposed by use of electronic ADCs, the industry lately has turned its focus on using photonics in ADCs to attempt to overcome such limitations.

FIG. 1 illustrates a typical generic photonic ADC 100, connected to external sources. As shown in FIG. 1, analog signal source 103 provides an analog signal to be digitized by ADC 100. The latter includes a conventional opto-electric track and holder amplifier (THA) 105, which is configured to sample the analog signal from source 103. Radio frequency (RF) oscillator 108 generates a sequence of electrical pulses at a predetermined frequency (fs), which may be on the order of 10 GHz. This sequence of pulses is used to drive mode lock laser (MLL) 111 of a conventional design to generate an optical clock signal of the corresponding frequency. Such an optical clock signal is fed via an optic waveguide 113 (shown using a hatched line to differentiate it from an electric waveguide shown using a solid line) to opto-electric THA 105 to drive its sampling clock. The analog signal samples from THA 105 are distributed amongst N conventional sub-ADCs denoted 119-1, 119-2 . . . , and 119-N, respectively, where N is a predetermined number. These N sub-ADCs, which may be electronic ADCs of well known design, are connected at the output of THA 105 in a "fan-out" arrangement. In a conventional manner, the magnitudes or values of the samples are expressed in electrical voltage. Dictated by clock signals (not shown), which are derived from that of RF oscillator 108 and which have a frequency of fs/N and different clock phases from one another, the sub-ADCs take in samples from THA 105 in a time-interleaved manner each at a rate of fs/N. The N sub-ADCs individually quantize the values of the clocked-in samples, and code the quantized sample values in binary bits, which are provided at the output of the sub-ADCs. Each sub-ADC may also sub-sample the clocked-in samples before its quantization process. Multiplexer 123 multiplexes the resulting binary bits from the N sub-ADCs to provide a bit sequence representing the digitized version of the analog signal input to ADC 100.

BRIEF SUMMARY

Shortcomings have been identified in the design of the typical photonic ADC 100 described above. One such shortcoming stems from the fact that sampling jitter, which adversely affects the precision of tracking by a THA of an analog signal input, increases with the sampling rate of the THA. Thus, as the sampling rate of THA 105 (fs) is required to increase over time to meet the demand for higher digital quality, more and more sampling jitter is introduced to THA 105, thereby corrupting the performance of ADC 100, which is undesirable. Another shortcoming stems from the fact that the clock signals to the respective sub-ADCs in ADC 100 need to traverse different signal path lengths before reaching the sub-ADCs. As N increases with the sampling rate fs, the relative lengths of the clock signal paths to some of the sub-ADCs become significantly different. As a result, the propagation of clock signals through some significantly different signal path lengths causes clock jitter which further corrupts the performance of ADC 100.

The invention overcomes the above-identified shortcomings by using M>1 sampling devices (e.g., THAs) in a photonic ADC to sample an analog signal input in a time-interleaved fashion. Advantageously, the sampling frequency at which each of the sampling devices operates is a fraction (e.g., 1/M) of fs used in ADC 100, thereby reducing the sampling jitter. In accordance with the invention, multiple optical clock signals having the same frequency (e.g., fs/M) but various clock phases are used in a photonic ADC. Each of the optical clock signals is associated with a respective one of the M sampling devices. The M sampling devices successively sample the analog signal input to provide samples thereof. The sampling operation by each sampling device is time-controlled by the optical clock signal associated with the sampling device. The resulting samples from the sampling devices being processed to provide quantized samples. The inventive ADC produces a digital signal output representing values of the quantized samples.

DETAILED DESCRIPTION

Figure 1:
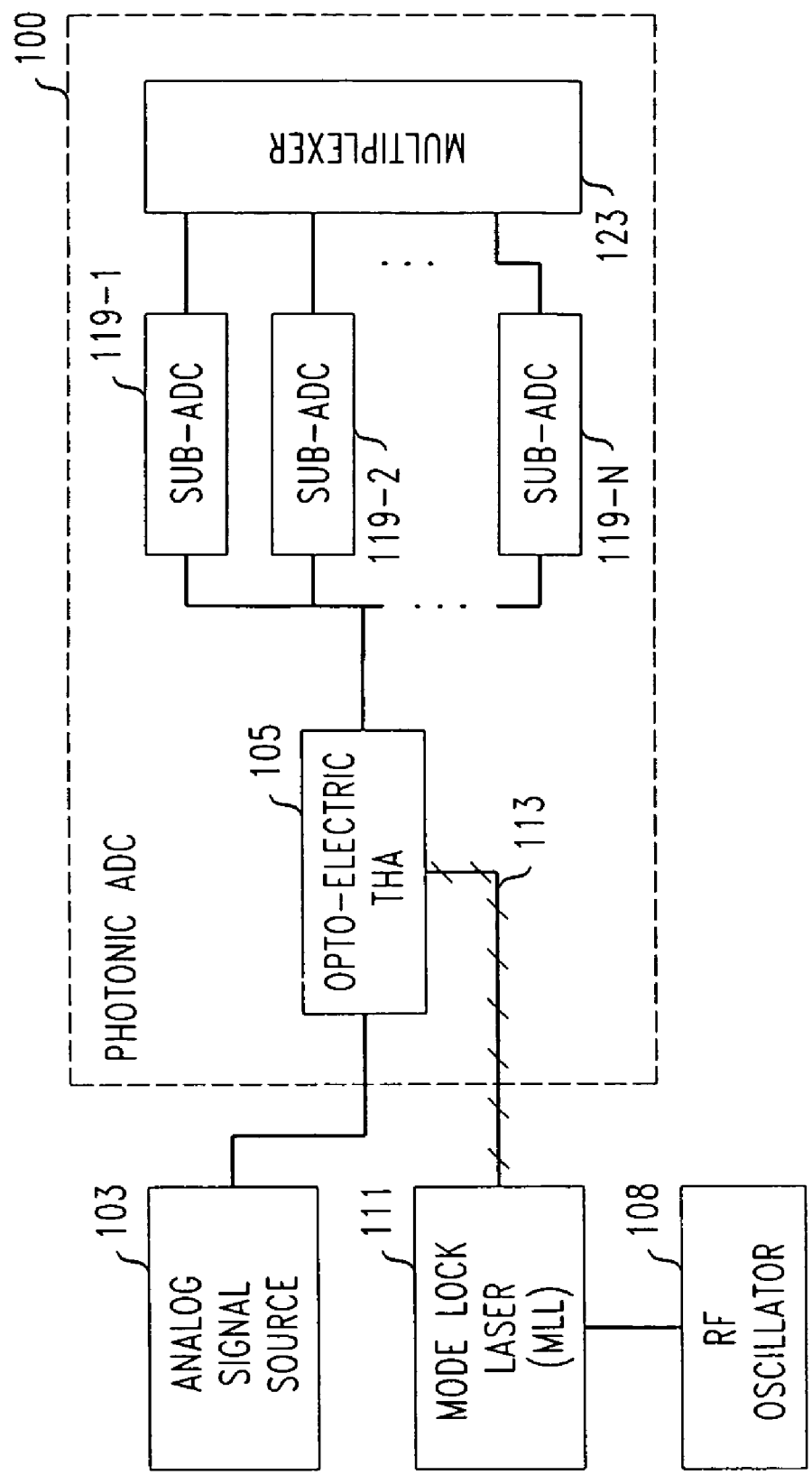
FIG. 1 is a block diagram including a typical photonic ADC.
Figure 2:
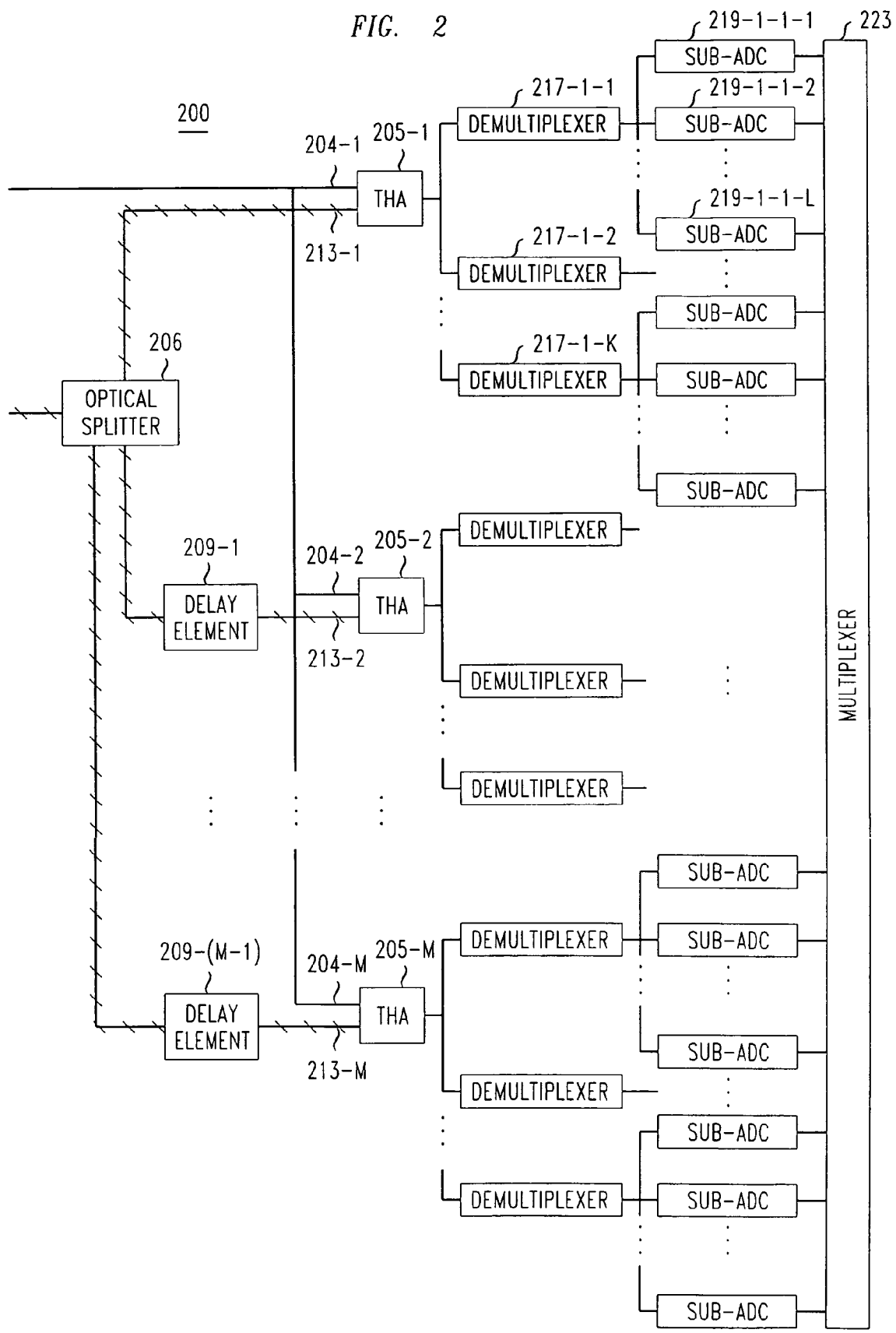
FIG. 2 is a block diagram of a photonic ADC in accordance with the invention.

FIG. 2 is a block diagram which illustrates photonic ADC 200 embodying the principles of the invention. Unlike ADC 100, photonic ADC 200 employs multiple opto-electric track and hold amplifiers (THAs) to perform time-interleaved photonic sampling in accordance with the invention. To that end, an analog signal (e.g., from analog signal source 103) to be digitized by ADC 200 is fed via electric waveguides 204-1, 204-2, ..., 204-M to M different opto-electric THAs, denoted 205-1, 205-2, ..., 205-M, respectively, where M>1. Because of use of the M THAs in accordance with the invention, the sampling rate required of each THA here is fs/M Hz, as opposed to the fs Hz sampling rate of THA 105 in ADC 100. As a result, ADC 200 here is subject to significantly less sampling jitter, compared with ADC 100.

An optical clock signal of a frequency fs/M Hz from an external source (e.g., from MLL driven by an Rf oscillator of the corresponding frequency) is provided to ADC 200 for achieving the fs/M Hz sampling rate accordingly. This optical signal is split by optical splitter 206 into M individual optical clock signals, M−1 of which are fed to optical delay elements 209-1, 209-2, ... and 209-(M−1), respectively. These delay elements impart different delays, $\tau_1, \tau_2 \ldots$ and $\tau_{M-1}$ to the respective input clock signals, resulting in M−1 delayed versions of the optical clock signal, which have different clock phases from one another and from the original optical clock signal.

Figure 3:
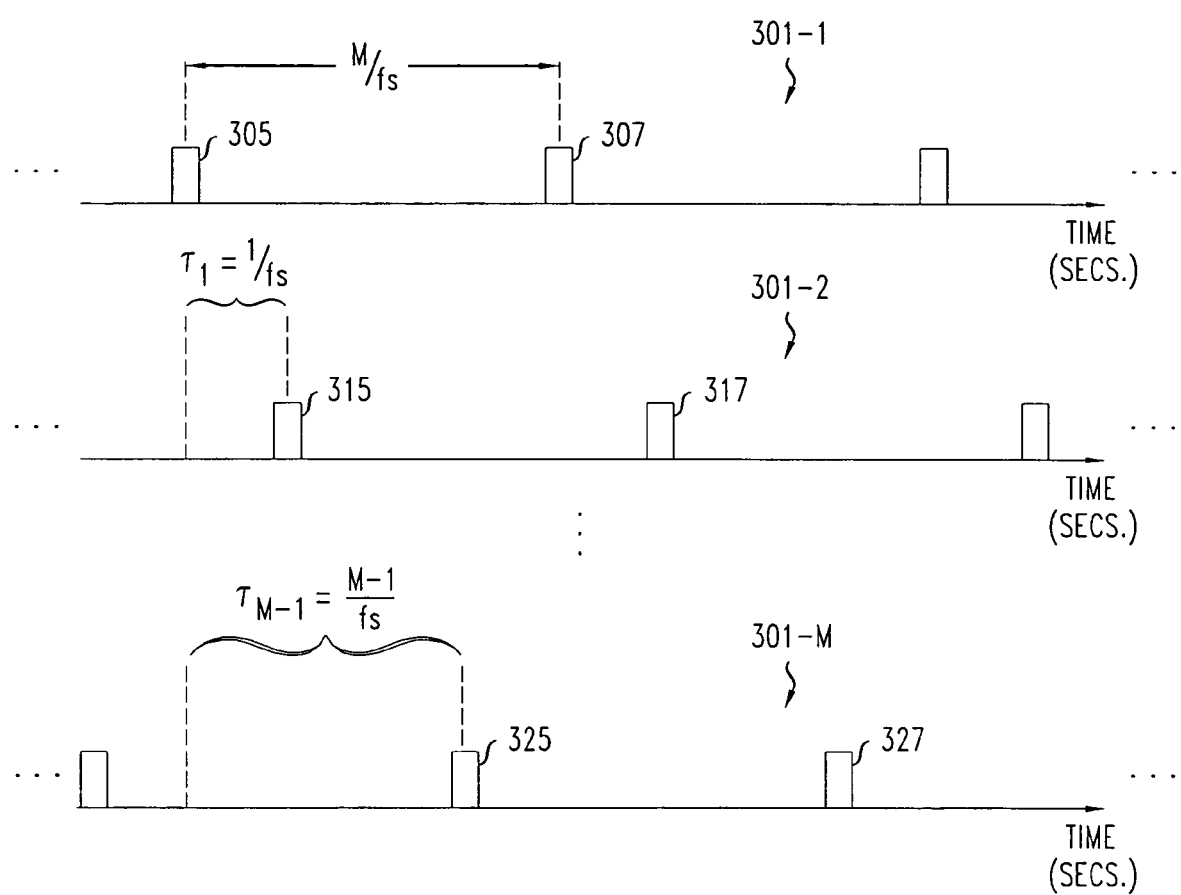
FIG. 3 is a timing diagram in which optical clock signals are depicted which have different clock phases from one another, and which are used to perform time-interleaved sampling in the ADC of FIG. 2.

FIG. 3 is a timing diagram in which the original and delayed versions of the optical clock signal are depicted. As shown in FIG. 3, original optical clock signal 301-1 contains a sequence of optical pulses including pulses 305 and 307 which occur periodically with a period of M/fs sec. Similarly, the other M−1 delayed versions of the optical clock signal each contain a sequence of optical pulses which occur periodically with a period of M/fs sec., as well. However, the optical pulses of each $\tau_{\alpha-1}$-delayed version lag behind the corresponding pulses of the original optical signal by $\tau_{\alpha-1}=(\alpha-1)/\text{fs}$ sec., where $1<\alpha\leq M$. Thus, in general each $\tau_{\alpha-1}$-delayed version has a different phase offset from the original optical signal, which equals $2\pi(\alpha-1)/M$ radians. For example, $\tau_1$-delayed version 301-2 includes optical pulses 315 and 317 which lag behind corresponding optical pulses 305 and 307 of original optical signal 301-1 by $\tau=1/\text{fs}$ sec. and thus has a phase offset of $2\pi/M$ radians therefrom. Similarly, $\tau_{M-1}$-delayed version 301-M includes optical pulses 325 and 327 which lag behind corresponding optical pulses 305 and 307 of original optical signal 301-1 by $\tau_{M-1}=(M-1)/\text{fs}$ sec. and thus has a phase offset of $2\pi(M-1)/M$ radians therefrom.

For example, each of delay elements 209-1, 209-2 ..., and 209-(M−1) in FIG. 2 may be an extra length of an optic waveguide through which an optical clock signal needs to traverse, where its actual length is calculated to provide the corresponding delay. Original and delayed versions of the optical clock signal 301-1, 301-2 ..., and 301-M are conveyed through optic waveguides 213-1, 213-2 ..., and 213-M to THA 205-1, 205-2 ..., and 205-M, respectively, to time-control their sampling operations. The circuit implementation of THA 205-1, 205-2 ..., and 205-M in an illustrative embodiment is fully disclosed hereinbelow. It suffices to know for now that each THA is responsive to optical pulses in the corresponding optical clock signal provided thereto to take samples of the analog signal input to ADC 200. In the illustrative embodiment to be described, the outputs of THA 205-1 through 205-M are charge steered sampled signals. In other words, the magnitudes of the samples from these THAs are measured by amperage of the currents flowing therefrom, as opposed to by voltage of the output of THA 105 in ADC 100.

To further distribute processing of the analog signal samples generated by the M THAs, each THA in accordance with the invention is coupled to one or more demultiplexers in ADC 200. For example, THA 205-1 is coupled to K demultiplexers denoted 217-1-1, 217-1-2, ..., 217-1-K, where $K\geq 1$. In general, THA 205-m is coupled to K demultiplexers 217-m-1, 217-m-2, ..., 217-m-K, where $1\leq m\leq M$. The implementation of these demultiplexers in ADC 200 is fully disclosed in the illustrative embodiment to be described. In that illustrative embodiment, the charge steered sampled signal from each THA propagates, through the corresponding K demultiplexers, to charge-steering sub-ADCs, also known as current-mode sub-ADCs. For example, these sub-ADCs each may be an electronic ADC whose design is well known. As shown in FIG. 2, each demultiplexer is coupled at its output to a fan-out of L sub-ADCs, where $L=N/(MK)$ in this instance. For example, demultiplexer 217-1-1 is coupled at its output to a fan-out of sub-ADCs 219-1-1-1, 219-1-1-2 ..., and 219-1-1-L. In general, demultiplexer 217-m-k is coupled at its output to a fan-out of sub-ADCs 219-m-k-1, 219-m-k-2 ..., and 219-m-k-L, where $1\leq k\leq K$.

It should be noted at this point that because of the relatively small number of sub-ADCs used in each fan-out here (L versus N in ADC 100), the lengths of the signal paths for delivering clock signals (not shown) to the respective sub-ADCs in the same fan-out are not significantly different. The substantially same clock signal path lengths introduce significantly less clock jitter, compared with that in ADC 100.

Each demultiplexer (e.g., 217-1-1) in ADC 200 delivers the samples it received (e.g., from THA 205-1) to the L sub-ADCs (e.g., 219-1-1-1, 219-1-1-2 ... and 219-1-1-L) connected thereto in a time-interleaved fashion. These L sub-ADCs, which may be conventional electronic ADCs as mentioned before, individually quantize the received samples and code the values of the quantized samples, e.g., in binary bits. Each sub-ADC here may additionally sub-sample the received samples before its quantization process. Multiplexer 223 multiplexes the binary bits from all of the N=MKL sub-ADCs in ADC 200 to form a bit sequence representing a digitized version of the analog signal input to ADC 200.

Figure 4:
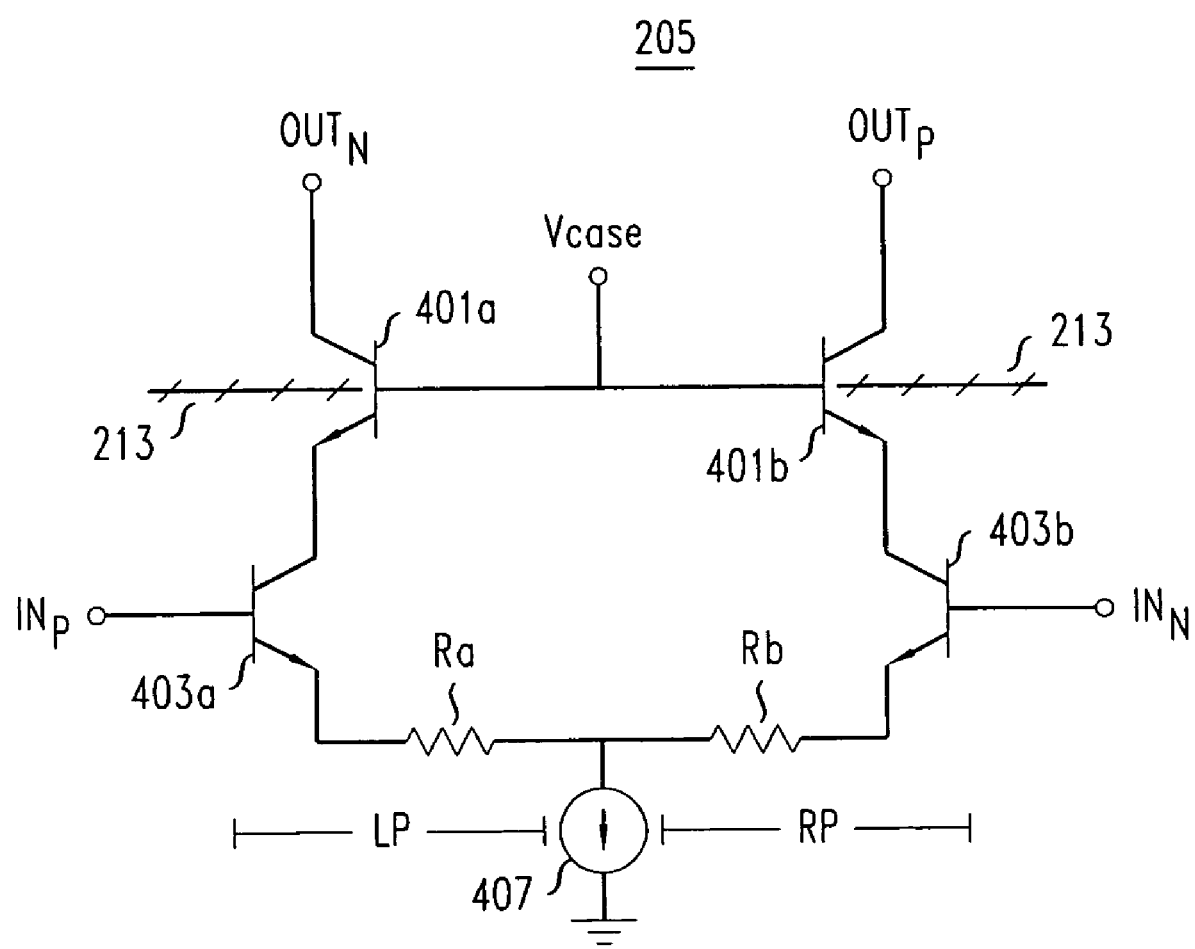
FIG. 4 illustrates a circuit implementation of a THA used in the ADC of FIG. 2.

Turning to the illustrative embodiment of the invention mentioned above, the analog signal input to ADC 200 in this particular embodiment is differential. As a result, various circuit implementations in ADC 200 have differential inputs that will generally be indicated as $IN_N$ and $IN_P$ and have differential outputs that will generally be indicated as OUTN and $OUT_P$. FIG. 4 illustrates a circuit implementation of an opto-electric THA 205, representative of THAs 205-1, 205-2 ... 205-M of FIG. 2. As shown in FIG. 4, THA 205 includes left and right portions, i.e., LP and RP, which are mirror images to each other and which produce output signals $OUT_N$ and $OUT_P$ in response to respective $IN_P$ and $IN_N$ input signals via substantially identical processing. Due to the processing by the substantially identical left and right portions LP and RP, THA 205 produces a differential pair of output signals $OUT_N$ and $OUT_P$ from the differential pair of input analog signals $IN_N$ and $IN_P$, received, e.g., from analog signal source 103. The left and right portions LP, RP of THA 205 each are controlled by an active current source 407 for flexibly controlling bias currents in THA 205.

The left and right portions LP, RP of THA 205 include switch transistors 401a and 401b, respectively, each of which may be a heterojunction photo transistor (HPT). The emitters of the switch transistor pair are connected to collectors of transistors 403a and 403b, respectively. Transistors 403a and 403b form a degenerated differential pair, each of which may be a heterojunction bipolar transistor (HBT). Transistors 403a and 403b are connected by their respective emitters to current source 407 through degeneration resisters Ra and Rb, respectively. Each switch transistor (401a, 401b) is biased by a DC voltage Vcase at its base, and can be turned on by optical pulses in an optical clock signal received via optic waveguide 213 (representative of optic waveguide 213-1, 213-2 ..., and 213-M). As demonstrated in FIG. 3, the optical pulses occur in the optical clock signal at a rate of fs/M Hz in this instance, enabling THA 205 to sample the differential analog signal inputs at the same rate. When switch transistors 401a and 401b are turned on by an optical clock pulse recurring at the sampling frequency of fs/M Hz, the differential outputs ($OUT_N$, $OUT_P$) become electrically connected to transistors 403a and 403b, respectively. As a result, each differential output receives a current through the corresponding one of transistors 403a and 403b, whose amperage is proportional to the magnitude of the differential analog signal inputs ($IN_P$, $IN_N$), thereby taking a sample of the differential analog signal inputs every M/fs second, which are provided at the bases of transistors 403a and 403b. Thus, as mentioned before, the value of each sample output is expressed in amperage of the current flowing from THA 205, and the signal output of THA 205 may be referred to as a charge steered sampled signal.

For other designs of a THA which may be adapted to use for THA 205, one may refer, e.g., to J. Lee, "Distributed Track-and-Hold Amplifier," U.S. Patent Publication No. 20080218257, Sep. 11, 2008, which is incorporated herein by reference. It should be pointed out that based on the disclosure of THA 205 heretofore, a person skilled in the art would readily be able to make apparent modifications to those designs as published so as to be used as THA 205. For example, one of the apparent modifications is to replace each switch transistor which is sensitive to an electrical clock signal in those designs with a HPT which is sensitive to an optical clock signal as in THA 205.

Figure 5:
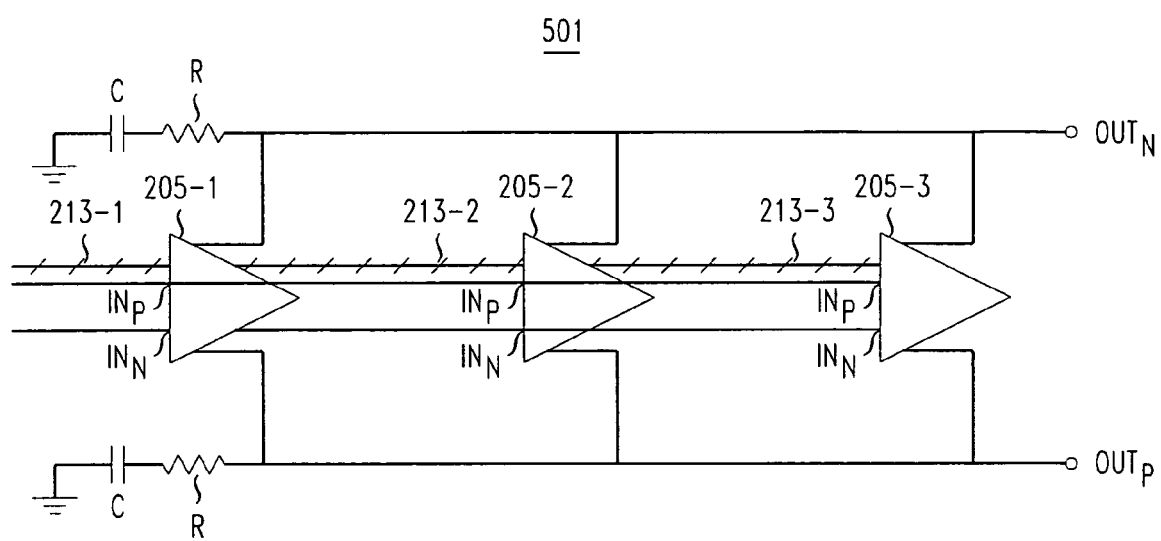
FIG. 5 illustrates a layout of multiple THAs in an integrated circuit (IC) package, in accordance with the invention.

In another illustrative embodiment of the invention, multiple THAs 205 are packaged in an IC chip in a distributed manner. FIG. 5 illustrates the layout of one such IC package 501 containing M=3 THAs 205, e.g., THA 205-1, THA 205-2 and THA 205-3. As shown in FIG. 5, THA 205-1, THA 205-2 and THA 205-3 are disposed in a linear fashion in IC package 501. In this instance, THAs 205-1, 205-2 and 205-3 each comprise THA 205 of FIG. 4 or its circuit equivalent, and they receive their respective optical clock signals at a sampling frequency of fs/3 Hz via optic waveguides 213-1, 213-2 and 213-3, respectively. Dictated by its optical clock signal, each THA takes turn sampling the differential analog signal inputs at its respective $IN_P$ and $IN_N$, and providing the corresponding differential outputs at $OUT_N$ and $OUT_P$ of IC package 501, respectively. For impedance matching, $OUT_N$ and $OUT_P$ each are grounded through a resistor R and capacitor C connected in series thereto.

Figure 6:
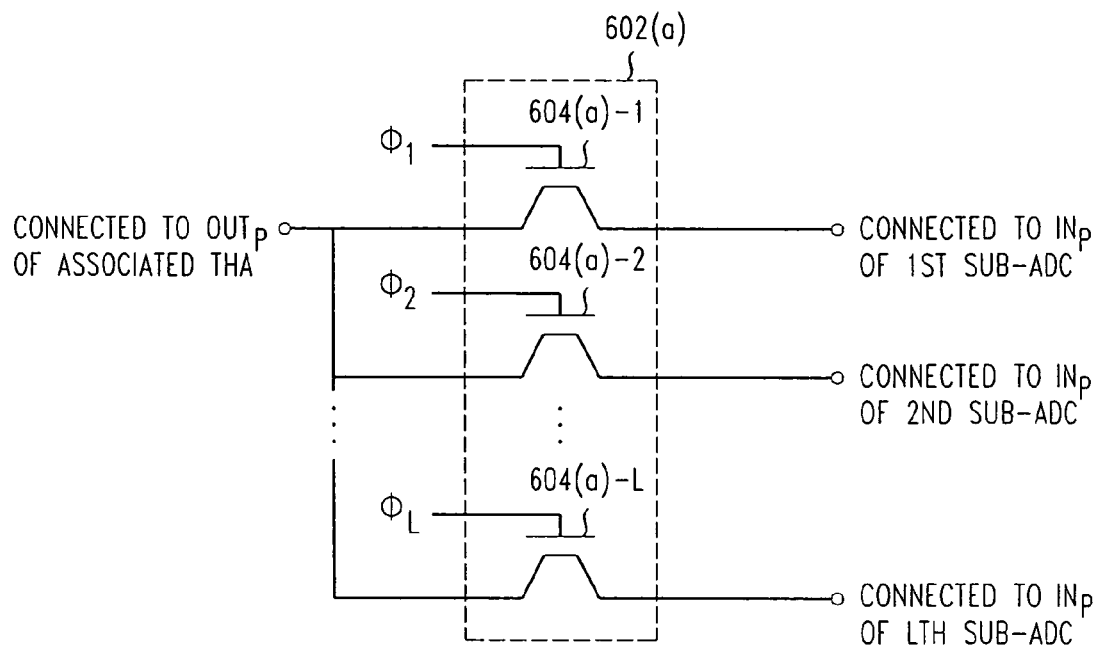
FIG. 6 illustrates a circuit implementation of a demultiplexer used in the ADC of FIG. 2.
Figure 6:
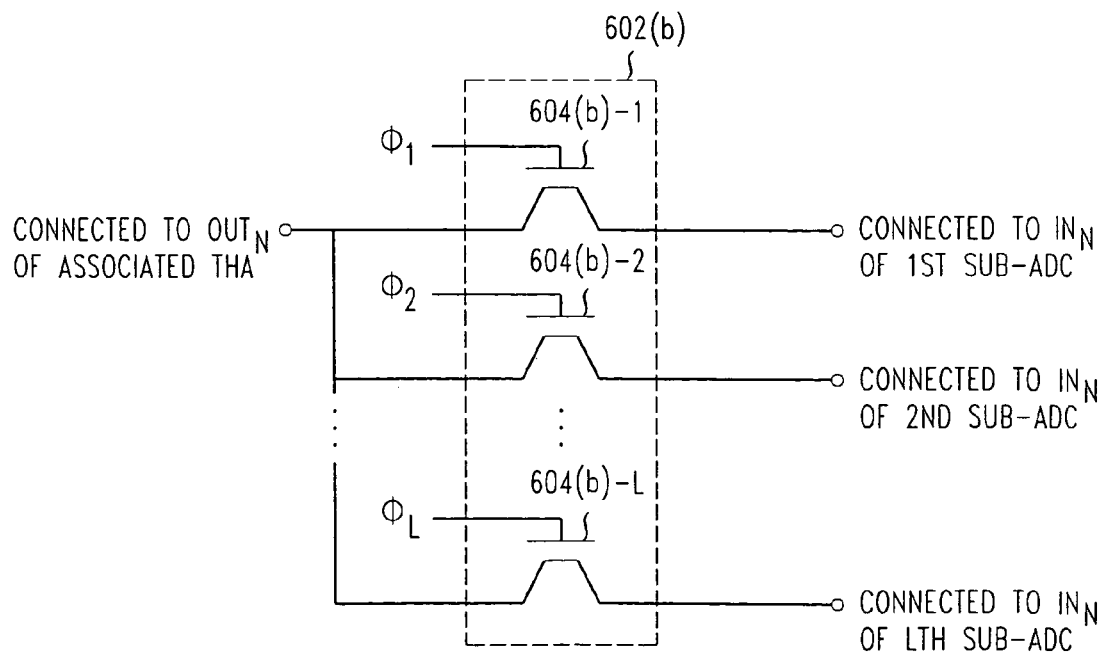

FIG. 6 illustrates an implementation of demultiplexer 217, representative of demultiplexer 217-m-k of ADC 200 of FIG. 2, where $1 \leq m \leq M$ and $1 \leq k \leq K$. As mentioned before, the sample output of each THA in this illustrative embodiment comprises differential $OUT_N$ and $OUT_P$ which are in the form of a current. In this instance, demultiplexer 217 may be implemented as two arrays of switch transistors denoted 602(a) and 602(b), respectively, with L transistors in each array. For example, the L transistors in array 602(a), denoted 604(a)-i, 604(a)-2 ..., and 604(a)-L, each may be an n-type metal oxide semiconductor field-effect transistor (MOSFET), while the L transistors in array 602(b), denoted 604(b)-1, 604(b)-2 ..., and 604(b)-L, each may be a p-type MOSFET. As such, complementary metal oxide semiconductor (CMOS) technology may be used to implement the n- and p-type transistor pairs 604(a)-1 and 604(b)-1, 604(a)-2 and 604(b)-2 ..., and 604(a)-L and 604(b)-L. Use of CMOS devices here is particularly desirable to keep power consumption of ADC 200 low. Each switch transistor in array 602(a), when turned on by an electrical pulse in a clock signal, conducts a sampled signal (in the form of a current) from the $OUT_P$ of the THA, connected to demultiplexer 217, to an input $IN_P$ of a sub-ADC, connected to the switch transistor. Similarly, each switch transistor in array 602(b), when turned on by an electrical pulse of a clock signal, conducts a sampled signal (in the form of a current) from the $OUT_N$ of the same THA to an input $IN_N$ of the same sub-ADC. Each sub-ADC may be a charge-steering differential sub-ADC whose design is well known. In this instance, the on/off states of transistors 604(a)-1 and 604(b)-1 are controlled by clock signal $\Phi_1$; the on/off states of transistors 604(a)-2 and 604(b)-2 are controlled by clock signal $\Phi_2$ ...; and the on/off states of transistors 604(a)-L and 604(b)-L are controlled by clock signal $\Phi_L$. These clock signals may be derived from the same Rf signal generated by a Rf oscillator, which is used to drive the MLL to produce the optical sampling clock signal (e.g., 301-1 in FIG. 3) described before. Clock signals $\Phi_1, \Phi_2, \ldots$, and $\Phi_L$ each have a frequency of fs/(MKL) Hz (i.e., fs/N Hz) in this instance but have different clock phases from one another. In implementation, clock signals $\Phi_2 \ldots$, and $\Phi_L$ may be different delayed versions of $\Phi_1$.

Figure 7:
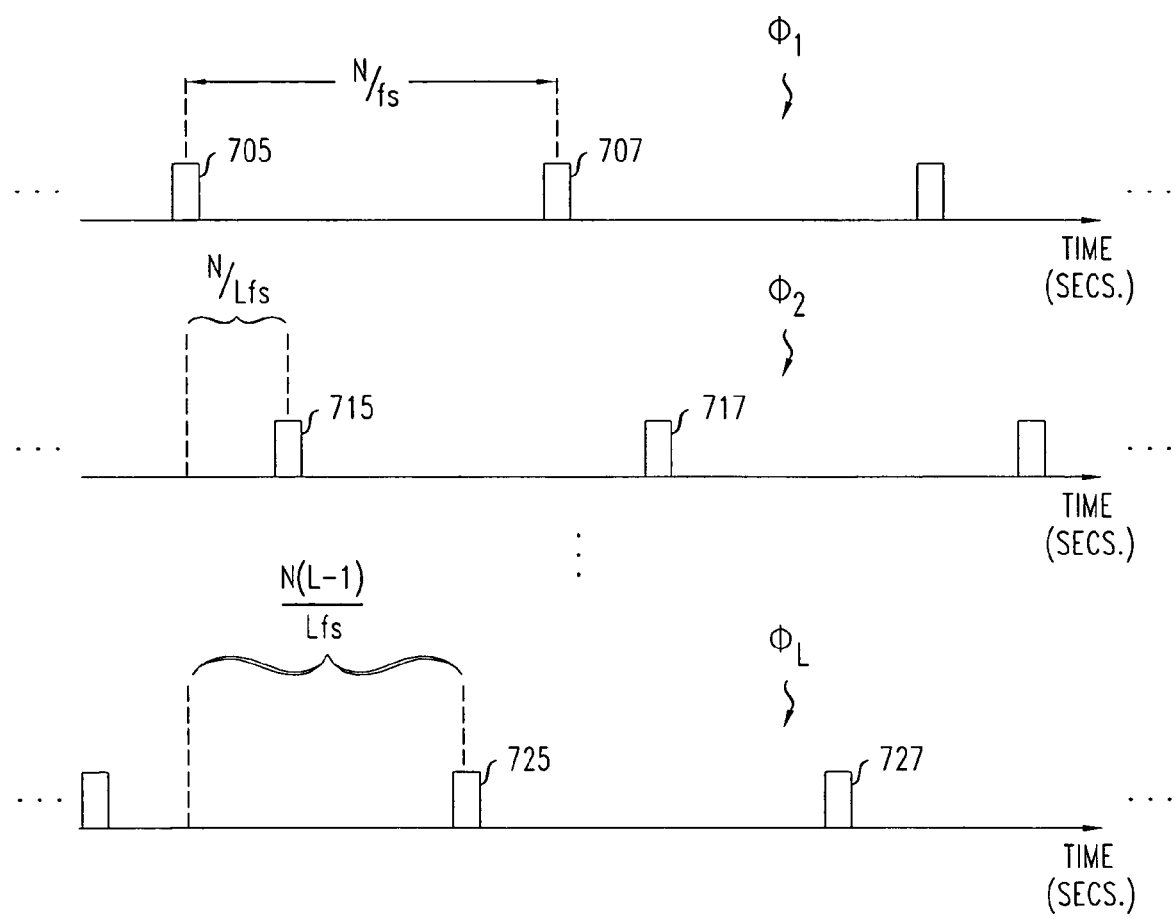
FIG. 7 is a timing diagram in which electrical clock signals are depicted which have different clock phases from one another, and which are used to perform time-interleaved demultiplexing in the ADC of FIG. 2.

FIG. 7 is a timing diagram in which the original ($\Phi_1$) and delayed versions ($\Phi_2 \ldots$, and $\Phi_L$) of the electrical clock signal are depicted. As shown in FIG. 7, original clock signal $\Phi_1$ contains a sequence of electrical pulses including pulses 705 and 707, which occur periodically with a period of N/fs sec. Similarly, the other L−1 delayed versions of the optical clock signal each contain a sequence of electrical pulses which occur periodically with a period of N/fs sec., as well. However, the electrical pulses of each $\Phi_\beta$ lag behind the corresponding pulses of $\Phi_1$ by $(\beta-1)N/(Lfs)$ sec., where $1 < \beta \leq L$. Thus, in general each $\Phi_\beta$ has a different phase offset from $\Phi_1$, which equals $2\pi(\beta-1)/L$ radians. For example, $\Phi_2$ includes electrical pulses 715 and 717 which lag behind corresponding pulses 705 and 707 of $\Phi_1$ by N/(Lfs) sec. and thus has a phase offset of $2\pi/L$ radians therefrom. Similarly, $\Phi_L$ includes electrical pulses 725 and 727 which lag behind corresponding pulses 705 and 707 of $\Phi_1$ by N(L−1)/(Lfs) sec. and thus has a phase offset of $2\pi(L-1)/L$ radians therefrom.

The foregoing merely illustrates the principles of the invention. It will thus be appreciated that those skilled in the art will be able to device numerous arrangements which embody the principles of the invention and are thus within its spirit and scope.

For example, although photonic ADC 200, as disclosed in FIG. 2, is embodied in the form of various discrete functional blocks, the ADC could equally well be embodied in an arrangement in which the functions of any one or more of those blocks or indeed, all of the functions thereof, are realized, for example, by one or more appropriately programmed processors or devices.

The invention claimed is:

1. An analog-to-digital signal conversion apparatus, comprising:
    an optical element for providing a plurality of optical clock signals having an identical frequency, at least one of the optical clock signals having a phase offset from a second one of the optical clock signals, the phase offset having a selected value based at least on the number of optical clock signals provided;

a plurality of sampling devices responsive to the optical clock signals for successively sampling an analog signal input to provide samples thereof, each of the optical clock signals being associated with a respective one of the sampling devices, at least one of the sampling devices being adapted to generate an electrical current whose amperage represents values of samples taken by the at least one sampling device; and one or more demultiplexers for distributing, in a time-controlled manner, the electrical current from the at least one sampling device to a plurality of processing elements for generating a digital signal representing values of quantized samples, which are derived from the sample values represented by the amperage of the electrical current.

2. The apparatus of claim 1 wherein the at least one optical clock signal is a delayed version of the second optical signal.

3. The apparatus of claim 1 wherein the plurality of optical clock signals are derived from an optical clock signal generated from a mode lock laser source.

4. The apparatus of claim 1 further comprising at least one optical delay element for providing the at least one optical signal.

5. The apparatus of claim 4 wherein the optical delay element comprises a predetermined length of an optical fiber.

6. The apparatus of claim 1 wherein at least one of the sampling devices comprises an opto-electric track and hold amplifier (THA).

7. The apparatus of claim 1 wherein the identical frequency varies with the number of sampling devices used.

8. The apparatus of claim 1 wherein the samples by the at least one sampling device are sub-sampled before the the digital signal is generated.

9. The apparatus of claim 1 wherein at least one of the processing elements comprises an electronic analog-to-digital signal converter.

10. The apparatus of claim 1 wherein the optical element comprises an optical splitter.

11. An analog-to-digital signal conversion apparatus, comprising:

a plurality of sampling devices for successively sampling an analog signal input in response to different optical clock signals, respectively, at least one of the sampling devices being adapted to generate an electrical current whose amperage represents values of samples taken by the at least one sampling device; and one or more demultiplexers for distributing, in a time-controlled manner, the electrical current from the at least one sampling device to a plurality of processing elements for generating a digital signal representing values of quantized samples, which are derived from the sample values represented by the amperage of the electrical current.

12. The apparatus of claim 11 wherein at least one of the sampling devices comprises an opto-electric THA.

13. The apparatus of claim 11 wherein at least one of the demultiplexers comprising a plurality of switch devices.

14. The apparatus of claim 13 wherein a plurality of clock signals are provided, each switch device being associated with a respective one of the clock signals, each switch device being turned on or off according to the clock signal associated therewith.

15. The apparatus of claim 11 wherein the samples taken by the at least one sampling device are sub-sampled by the plurality of the processing elements.

16. The apparatus of claim 11 wherein at least one of the processing elements is an electronic analog-to-digital signal converter.

17. A method for converting an analog signal input to a digital signal output, comprising:

providing a plurality of optical clock signals having an identical frequency, at least one of the optical clock signals having a phase offset from a second one of the optical clock signals, the phase offset having a selected value based at least on the number of optical clock signals provided;

using a plurality of sampling devices which are responsive to the optical clock signals to successively sample an analog signal input to provide samples thereof, each of the optical clock signals being associated with a respective one of the sampling devices;

generating an electrical current whose amperage represents values of samples taken by at least one of the sampling device; and distributing, in a time-controlled manner, the electrical current from the at least one sampling device to a plurality of processing elements for generating a digital signal representing values of quantized samples, which are derived from the sample values represented by the amperage of the electrical current.

18. The method of claim 17 wherein the at least one optical clock signal is a delayed version of the second optical signal.

19. The method of claim 17 wherein the identical frequency varies with the number of sampling devices used.

20. The method of claim 17 wherein the samples by the at least one sampling device are sub-sampled before the the digital signal is generated.

* * * * *